US011362643B2

(12) United States Patent
Takata

(10) Patent No.: US 11,362,643 B2
(45) Date of Patent: Jun. 14, 2022

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 190 days.

(21) Appl. No.: 16/897,318

(22) Filed: Jun. 10, 2020

(65) Prior Publication Data

US 2020/0412335 A1    Dec. 31, 2020

(30) Foreign Application Priority Data

Jun. 25, 2019  (JP) .............................. JP2019-116899

(51) Int. Cl.
*H03H 9/72* (2006.01)
*H03H 9/64* (2006.01)
*H03H 9/145* (2006.01)

(52) U.S. Cl.
CPC .......... *H03H 9/6489* (2013.01); *H03H 9/145* (2013.01); *H03H 9/6483* (2013.01); *H03H 9/72* (2013.01)

(58) Field of Classification Search
CPC .............................................. H03H 9/70–725
See application file for complete search history.

(56) References Cited

U.S. PATENT DOCUMENTS

| 9,520,857 | B2* | 12/2016 | Fujiwara | ................ H03H 9/542 |
| 10,069,476 | B2* | 9/2018 | Hara | .................... H03H 9/6479 |
| 10,135,422 | B2* | 11/2018 | Goto | ......................... H04L 5/14 |
| 10,250,230 | B2* | 4/2019 | Ono | ...................... H03H 9/0576 |
| 10,727,812 | B2* | 7/2020 | Araki | ....................... H03H 9/54 |
| 10,873,319 | B2* | 12/2020 | Swamy | .............. H03H 9/02574 |
| 2013/0113576 | A1 | 5/2013 | Inoue et al. | |

FOREIGN PATENT DOCUMENTS

JP    2013-118611 A    6/2013

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

A multiplexer includes first and second filters and additional circuits. The first filter is coupled to transmit and antenna terminals, the second filter is coupled to receive and antenna terminals, one additional circuit is coupled to transmit and receive terminals, and another additional circuit is coupled to transmit and antenna terminals. Pass bands of the first and second filters are respectively first and second frequency bands, and the second frequency band including a center frequency higher than a center frequency of the first frequency band. The one additional circuit includes a first resonator group including first IDT electrodes aligned in a propagation direction of an acoustic wave. The other additional circuit includes a second resonator group including second IDT electrodes aligned in the propagation direction. An average pitch of electrode fingers is greater among the first IDT electrodes than the second IDT electrodes.

19 Claims, 11 Drawing Sheets

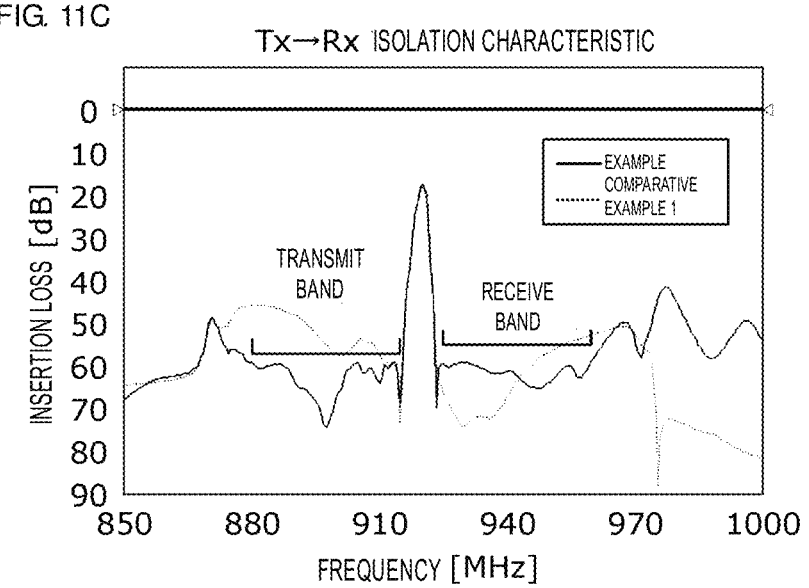

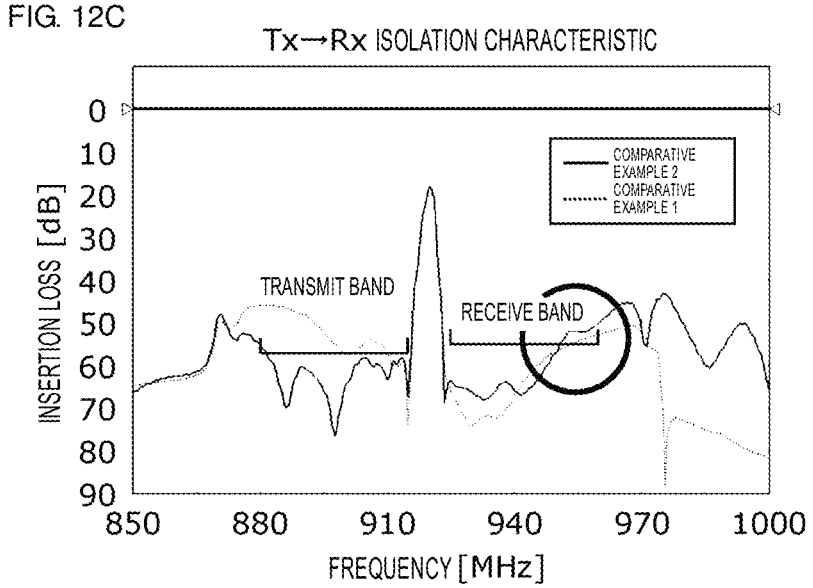

MULTIPLEXER

CROSS REFERENCE TO RELATED APPLICATIONS

This application claims the benefit of priority to Japanese Patent Application No. 2019-116899 filed on Jun. 25, 2019. The entire contents of this application are hereby incorporated herein by reference.

BACKGROUND OF THE INVENTION

1. Field of the Invention

The present invention relates to a multiplexer including an additional circuit.

2. Description of the Related Art

Heretofore, a configuration for improving isolation between a transmit terminal and a receive terminal of a separator with respect to both a transmit band and a receive band is known (for example, Japanese Unexamined Patent Application Publication No. 2013-118611).

Japanese Unexamined Patent Application Publication No. 2013-118611 discloses a configuration in which a cancellation circuit is coupled between a node in a transmit filter and a node in a receive filter (FIG. 17A). Furthermore, another configuration is disclosed in which a cancellation circuit is coupled between a transmit terminal and an antenna terminal and another cancellation circuit is coupled between the antenna terminal and a receive terminal (FIG. 17D).

Here, the cancellation circuit is configured to deliberately generate a cancellation signal of an opposite phase and an almost identical amplitude with respect to an undesired signal that leaks from a target signal path to which the cancellation circuit is coupled. With respect to the entire signal path including the cancellation circuit and the target signal path, the amplitude of the undesired signal is reduced because the undesired signal is canceled out by the cancellation signal, and as a result, isolation is improved. In this specification, the cancellation circuit is also referred to as an additional circuit.

However, the configuration disclosed in Japanese Unexamined Patent Application Publication No. 2013-118611 does not always achieve sufficient isolation effects over a wide range including transmit and receive bands.

SUMMARY OF THE INVENTION

Preferred embodiments of the present invention provide multiplexers that each have an excellent isolation characteristic.

A multiplexer according to a preferred embodiment of the present invention includes a common terminal, a first terminal, a second terminal, a first filter with one end coupled to the first terminal and another end coupled to the common terminal, the pass band of the first filter being a first frequency band, a second filter with one end coupled to the second terminal and another end coupled to the common terminal, the pass band of the second filter being a second frequency band including a center frequency higher than a center frequency of the first frequency band, a first additional circuit with one end coupled to the first terminal and another end coupled to the second terminal, and a second additional circuit with one end coupled to the first terminal and another end coupled to the common terminal. The first additional circuit includes a first resonator group including a plurality of first interdigital transducer (IDT) electrodes aligned in a propagation direction of an acoustic wave. The second additional circuit includes a second resonator group including a plurality of second IDT electrodes aligned in the propagation direction of the acoustic wave. An average pitch of electrode fingers of the plurality of first IDT electrodes is greater than an average pitch of electrode fingers of the plurality of second IDT electrodes.

In the multiplexer described above, between the first additional circuit and the second additional circuit, the first additional circuit, in which the average pitch of electrode fingers of the IDT electrodes is relatively great, generates a first cancellation signal of an opposite phase with respect to a signal in the first frequency band including a relatively low center frequency. With this configuration, it is possible to improve isolation in the first frequency band by using the first additional circuit. By contrast, the second additional circuit, in which the average pitch of electrode fingers of the IDT electrodes is relatively small, generates the second cancellation signal of an opposite phase with respect to a signal in the second frequency band including a relatively high center frequency. With this configuration, it is possible to improve isolation in the second frequency band by using the second additional circuit.

In the region in which the first cancellation signal generated by the first additional circuit is not in antiphase with respect to signals in the second frequency band, the first additional circuit defines and functions as parasitic capacitance, and consequently, isolation in the second frequency band is degraded. However, in the multiplexer described above, relatively great attenuation in the second frequency band is able to be achieved, and additionally, the parasitic capacitance component can be relatively small due to the relatively great average pitch of electrode fingers, and as a result, it is possible to reduce or minimize degradation of isolation in the second frequency band due to the first additional circuit.

As described above, the multiplexers according to preferred embodiments of the present invention are each able to effectively improve isolation in both the first frequency band and the second frequency band.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 11C is a graph illustrating an example of the transfer characteristic between the transmit terminal and the receive terminal of a duplexer according to a preferred embodiment of the present invention in contrast with Comparative Example 1.

FIG. 12C is a graph illustrating an example of the transfer characteristic between the transmit terminal and the receive terminal of the duplexer according to Comparative Example 2 in contrast with Comparative Example 1.

DETAILED DESCRIPTION OF THE PREFERRED EMBODIMENTS

Hereinafter, preferred embodiments of the present invention will be described in detail with reference to the drawings. It should be noted that the preferred embodiments described below are specific or comprehensive examples. The numerical values, the shapes, the materials, the elements, the arrangements of the elements, the connection configurations, and the like described in the following preferred embodiments are merely examples and are not intended to limit the present invention. It should be noted that, in the preferred embodiments described below, "coupled" includes not only the state of being coupled by a conductive wire but also the state of being electrically coupled via any circuit element.

A multiplexer according to a preferred embodiment of the present invention is described using an example of a duplexer including a transmit filter and a receive filter.

Figure 1:
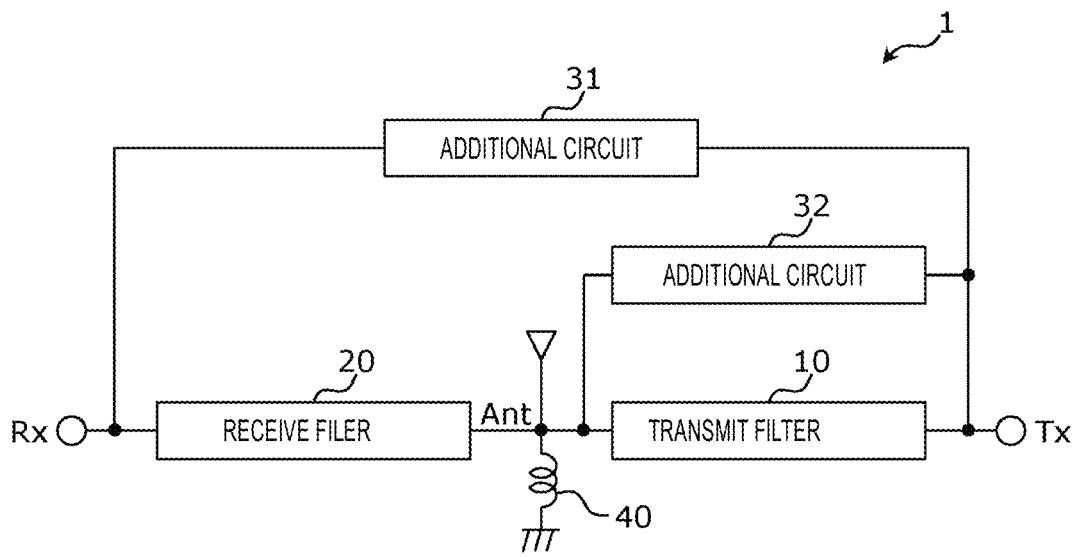
FIG. 1 is a circuit diagram illustrating an example of a configuration of a duplexer according to a preferred embodiment of the present invention.

FIG. 1 is a circuit diagram illustrating an example of a configuration of a duplexer according to a preferred embodiment of the present invention. As illustrated in FIG. 1, a duplexer 1 includes terminals Ant, Tx, and Rx, a transmit filter 10, a receive filter 20, and additional circuits 31 and 32. An inductor 40 providing impedance matching is coupled to the terminal Ant.

The pass band of the transmit filter 10 is a transmit frequency band. One end of the transmit filter 10 is coupled to the terminal Tx while the other end of the transmit filter 10 is coupled to the terminal Ant.

The pass band of the receive filter 20 is a receive frequency band including a center frequency higher than a center frequency of the transmit frequency band. One end of the receive filter 20 is coupled to the terminal Rx while the other end of the receive filter 20 is coupled to the terminal Ant.

The additional circuit 31 generates a first cancellation signal for a first signal component targeted for cancellation in the transmit frequency band of signals transferred between the terminals Tx and Rx via the transmit filter 10 and the receive filter 20. The first cancellation signal is determined such that, when the first cancellation signal and the first signal component are added together, the amplitude of the addition result is smaller than the amplitude of the first signal component. The first cancellation signal is of an opposite phase and preferably of an identical or substantially identical amplitude with respect to the first signal component.

One end of the additional circuit 31 is coupled to the terminal Tx while the other end of the additional circuit 31 is coupled to the terminal Rx. In the example in FIG. 1, one end of the additional circuit 31 is directly coupled to the terminal Tx and the other end of the additional circuit 31 is directly coupled to the terminal Rx, but the configuration is not limited to this example. The additional circuit 31 may be coupled to a node in the transmit filter 10 and a node in the receive filter 20 (not illustrated in the drawing). This means that one end of the additional circuit 31 may be coupled to the terminal Tx via a portion of the transmit filter 10 and the other end of the additional circuit 31 may be coupled to the terminal Rx via a portion of the receive filter 20, for example.

The additional circuit 32 generates a second cancellation signal for a second signal component targeted for cancellation in the receive frequency band out of signals transferred between the terminals Tx and Ant via the transmit filter 10. The second cancellation signal is determined such that, when the second cancellation signal and the second signal component are added together, the amplitude of the addition result is smaller than the amplitude of the second signal component. The second cancellation signal is of an opposite phase and preferably of an identical or substantially identical amplitude with respect to the second signal component.

One end of the additional circuit 32 is coupled to the terminal Tx while the other end of the additional circuit 32 is coupled to the terminal Ant. In the example in FIG. 1, the additional circuit 32 is coupled in parallel with the entire transmit filter 10, but the configuration is not limited to this example and the additional circuit 32 may be coupled in parallel with a portion of the transmit filter 10 (not illustrated in the drawing). This means that one end of the additional circuit 32 may be coupled to the terminal Tx via a portion of the transmit filter 10 and the other end of the additional circuit 32 may be coupled to the terminal Ant via another portion of the transmit filter 10.

The state in which a signal component targeted for cancellation and a cancellation signal are in antiphase denotes that the absolute value of phase difference between the signal component and the cancellation signal is greater than 90° within the range of −180° to 180°. This is equal to the state in which the signal component targeted for cancellation and the cancellation signal indicate different phase components in opposite directions.

Additionally, it is preferable that the amplitude of the cancellation signal be identical or substantially identical to the amplitude of the signal component targeted for cancellation, but the amplitude of the cancellation signal and the amplitude of the signal component targeted for cancellation may be different from each other. When the amplitude of the addition result obtained by adding together the cancellation signal and the signal component targeted for cancellation is smaller than the amplitude of the original signal component targeted for cancellation, it is possible to improve isolation in the corresponding frequency band.

In the above description, the duplexer 1 is an example of a multiplexer. The terminals Ant, Tx, and Rx are examples of a common terminal, a first terminal, and a second terminal. The transmit filter 10 and the receive filter 20 are examples of a first filter and a second filter. The transmit frequency band and the receive frequency band are examples of a first frequency band and a second frequency band. The additional circuit 31 and the additional circuit 32 are examples of a first additional circuit and a second additional circuit.

Figure 2:
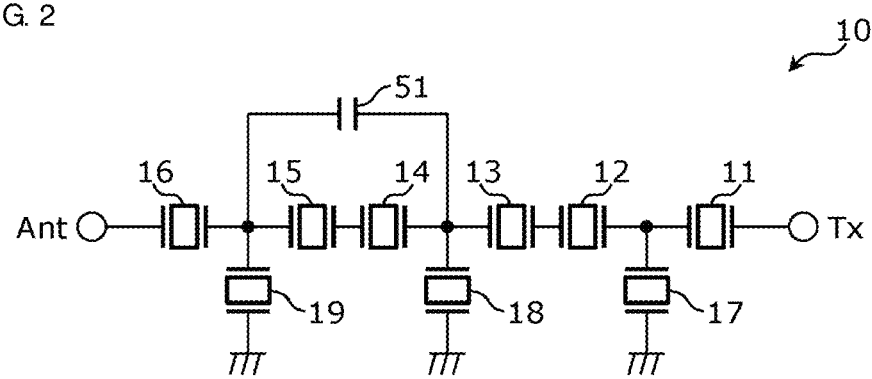
FIG. 2 is a circuit diagram illustrating an example of a configuration of a transmit filter according to a preferred embodiment of the present invention.

FIG. 2 is a circuit diagram illustrating an example of a configuration of the transmit filter 10. As illustrated in FIG. 2, the transmit filter 10 is a ladder filter including series resonators 11 to 16 and parallel resonators 17 to 19, for example.

The series resonators 11 to 16 are coupled in series with each other between the terminals Tx and Ant. A capacitor 51 is coupled to the series resonators 14 and 15 in a bridge configuration to improve instantaneous transition (hereinafter also referred to as the shoulder characteristic) of the bandpass characteristic of the transmit filter 10 at band edges. The parallel resonators 17 to 19 are each coupled between ground and a corresponding node on a signal path constituted by the series resonators 11 to 16. The series resonators 11 to 16 and the parallel resonators 17 to 19 may preferably be surface acoustic wave resonators, for example.

Figure 3:
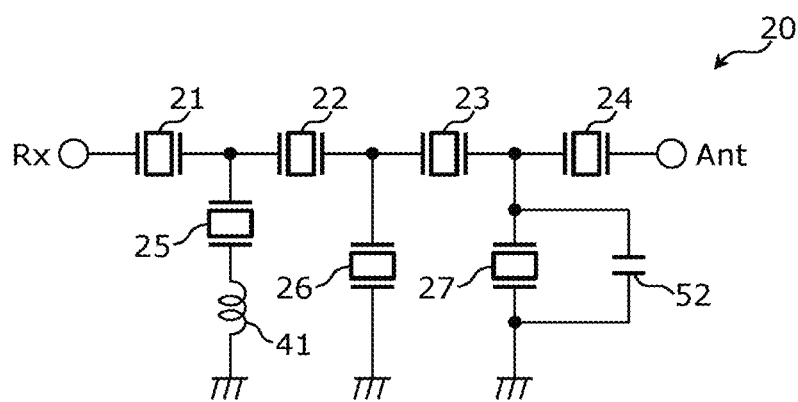
FIG. 3 is a circuit diagram illustrating an example of a configuration of a receive filter according to a preferred embodiment of the present invention.

FIG. 3 is a circuit diagram illustrating an example of a configuration of the receive filter 20. As illustrated in FIG. 3, the receive filter 20 is a ladder filter composed of series resonators 21 to 24 and parallel resonators 25 to 27, for example.

The series resonators 21 to 24 are coupled in series with each other between the terminals Rx and Ant. The parallel resonators 25 to 27 are each coupled between ground and a corresponding node on a signal path constituted by the series resonators 21 to 24. An inductor 41 is coupled between the parallel resonator 25 and ground to increase isolation improvement in the transmit frequency band achieved by using the additional circuit 31. A capacitor 52 is coupled to the parallel resonator 27 in a bridge configuration to improve the shoulder characteristic of the receive filter 20. The series resonators 21 to 24 and the parallel resonators 25 to 27 may preferably be surface acoustic wave resonators, for example.

Figure 4:
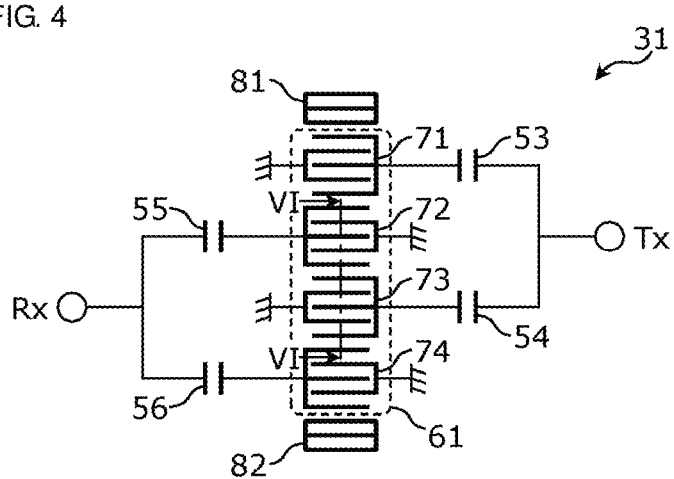
FIG. 4 is a circuit diagram illustrating an example of a configuration of a first additional circuit according to a preferred embodiment of the present invention.

FIG. 4 is a circuit diagram illustrating an example of a configuration of the additional circuit 31. As illustrated in FIG. 4, the additional circuit 31 includes a resonator group 61 including IDT electrodes 71 to 74 aligned in a propagation direction (an up-down direction in FIG. 4) of acoustic waves, reflectors 81 and 82, and capacitors 53 to 56.

The IDT electrodes 71 to 74 each include a pair of comb-shaped electrodes. The comb-shaped electrodes each include a plurality of electrode fingers extending in a direction (a left-right direction in FIG. 4) perpendicular or substantially perpendicular to the propagation direction of acoustic waves and a busbar electrode coupling one ends of the plurality of electrode fingers to each other. The number of electrode fingers for one IDT electrode is not limited to five as illustrated in FIG. 4 as an example but may differ among the IDT electrodes 71 to 74. In the example in FIG. 4, the resonator group 61 preferably defines, for example, in combination with the reflectors 81 and 82, a longitudinally coupled resonator that transfers signals using acoustic wave coupling, but the configuration is not limited to this example. The resonator group 61 may define, for example, a transversal filter that transfers signals by using acoustic wave propagation. In the transversal filter, a sound-absorbing member may be provided instead of the reflectors 81 and 82.

Figure 5:
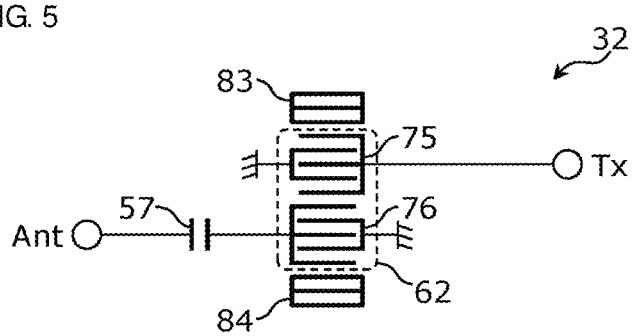
FIG. 5 is a circuit diagram illustrating an example of a configuration of a second additional circuit according to a preferred embodiment of the present invention.

FIG. 5 is a circuit diagram illustrating an example of a configuration of the additional circuit 32. As illustrated in FIG. 5, the additional circuit 32 includes a resonator group 62 including IDT electrodes 75 and 76 aligned in a propagation direction of acoustic waves (an up-down direction in FIG. 5), reflectors 83 and 84, and a capacitor 57.

The IDT electrodes 75 and 76 each include a pair of comb-shaped electrodes. The comb-shaped electrodes each include a plurality of electrode fingers extending in a direction (a left-right direction in FIG. 5) perpendicular or substantially perpendicular to the propagation direction of acoustic waves and a busbar electrode coupling one ends of the plurality of electrode fingers to each other. The number of electrode fingers for one IDT electrode is not limited to five as illustrated in FIG. 5 as an example but may differ between the IDT electrodes 75 and 76.

In the example in FIG. 5, the resonator group 62 defines, for example, in combination with the reflectors 83 and 84, a longitudinally coupled resonator that transfers signals by using acoustic wave coupling, but the configuration is not limited to this example. The resonator group 62 may define, for example, a transversal filter that transfers signals by using acoustic wave propagation. In the transversal filter, a sound-absorbing member may be provided instead of the reflectors 83 and 84.

Next, a sectional structure of the resonator groups 61 and 62 is described. The resonator groups 61 and 62 both are configured to have an identical or almost identical sectional structure and a sectional structure of the resonator group 61 is described below as a representative structure.

Figure 6:
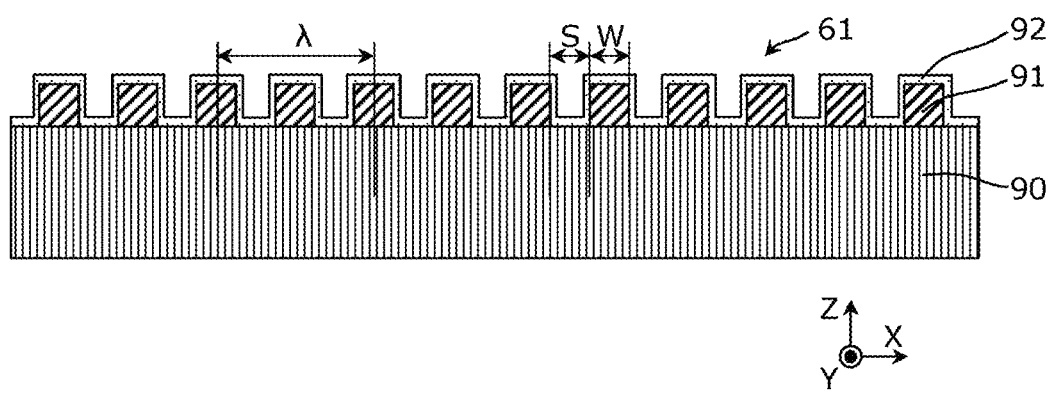
FIG. 6 is a schematic sectional view of an example of a structure including interdigital transducer (IDT) electrodes according to a preferred embodiment of the present invention.

FIG. 6 is a sectional view of an example of the sectional structure of the resonator group 61. FIG. 6 illustrates an example of a section taken along line VI-VI in FIG. 4. As illustrated in FIG. 6, the resonator group 61 includes a substrate 90, an electrode 91 provided on a major surface of the substrate 90, and a protective layer 92 covering the electrode 91.

The substrate 90 is preferably made of, for example, a piezoelectric material of Y-cut lithium niobate single crystal. In this case, the resonator group 61 defines and functions as a Love surface acoustic wave element. The electrode 91 is preferably made of, for example, an alloy mainly including aluminum. The protective layer 92 is preferably made of, for example, a film mainly including silicon dioxide.

Parameters for determining the shape and the size of the IDT electrode are referred to as electrode parameters. FIG. 6 indicates, as an example of the electrode parameters, a width W of the line of an electrode finger, a width S of the space between adjacent electrode fingers, and a wave length k that represents a repetition cycle of electrode fingers of any one of a pair of comb-shaped electrodes.

A repetition cycle (W+S) of electrode fingers of both comb-shaped electrodes of a pair of comb-shaped electrodes is referred to as a pitch of electrode fingers. The pitch of electrode fingers may differ among the IDT electrodes. Alternatively, the pitch of electrode fingers may differ between some of the electrode fingers and others of the electrode fingers constituting one IDT electrode.

The average pitch of electrode fingers of the IDT electrodes 71 to 74 included in the additional circuit 31 is greater than the average pitch of electrode fingers of the IDT electrodes 75 and 76 included in the additional circuit 32. Here, the average pitch of electrode fingers is a value obtained by dividing the sum of pitches of the electrode fingers, that is, a measured value of the distance between the centers of electrode fingers on both sides of an IDT electrode by the number of the electrode fingers.

Between the additional circuit 31 and the additional circuit 32, the additional circuit 31, in which the average pitch of electrode fingers of the IDT electrodes 71 to 74 is relatively great, generates the first cancellation signal of an opposite phase with respect to a signal in the transmit frequency band including a relatively low center frequency. By contrast, the additional circuit 32, in which the average pitch of electrode fingers of the IDT electrodes 75 and 76 is relatively small, generates the second cancellation signal of an opposite phase with respect to a signal in the receive frequency band including a relatively high center frequency. With this configuration, it is possible to improve isolation in the transmit frequency band by using the additional circuit 31 while it is possible to improve isolation in the receive frequency band by using the additional circuit 32.

In the case in which the first cancellation signal generated by the additional circuit 31 and a signal in the receive frequency band are not in antiphase, the additional circuit 31 can be a factor that degrades isolation in the receive frequency band. In this case, the additional circuit 31, in which the average pitch of electrode fingers of the IDT electrodes 71 to 74 is greater in comparison to the additional circuit 32, can achieve relatively great attenuation in the receive frequency band. This lessens the parasitic capacitance component in the additional circuit 31 in the receive frequency band, and as a result, it is possible to minimize the degradation of isolation in the additional circuit 31 due to parasitic capacitance.

As describe above, the duplexer 1 can effectively improve isolation between the terminals Tx and Rx in both the transmit frequency band and the receive frequency band.

The above advantageous effects will be described in more detail in comparison to a comparative example. In the following description, the duplexer 1 in FIG. 1 is referred to as Example of a preferred embodiment of the present invention.

Figure 7:
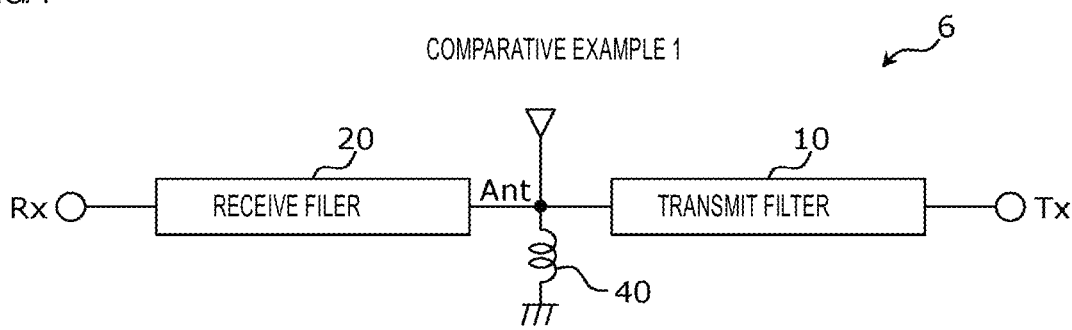
FIG. 7 is a circuit diagram illustrating an example of a configuration of a duplexer according to Comparative Example 1.

FIG. 7 is a circuit diagram illustrating an example of a configuration of a duplexer according to Comparative Example 1. A duplexer 6 illustrated in FIG. 7 differs from the duplexer 1 in FIG. 1 in that the additional circuits 31 and 32 are removed.

Figure 8:
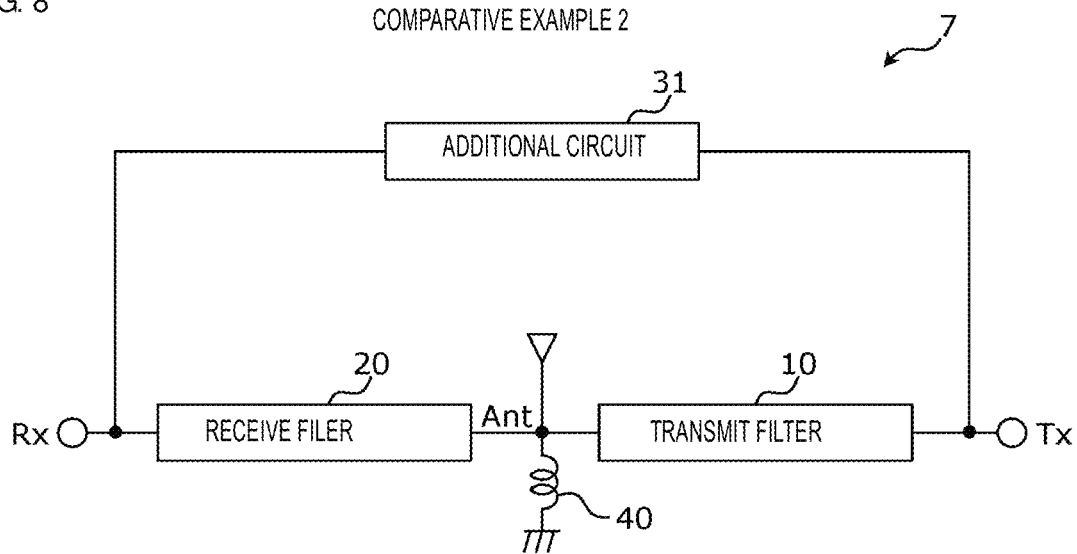
FIG. 8 is a circuit diagram illustrating an example of a configuration of a duplexer according to Comparative Example 2.

FIG. 8 is a circuit diagram illustrating an example of a configuration of a duplexer according to Comparative Example 2. A duplexer 7 illustrated in FIG. 8 differs from the duplexer 1 in FIG. 1 in that the additional circuit 32 is removed. The configuration of the duplexer 7 corresponds to the configuration disclosed in FIG. 17A in Japanese Unexamined Patent Application Publication No. 2013-118611.

Figure 9:
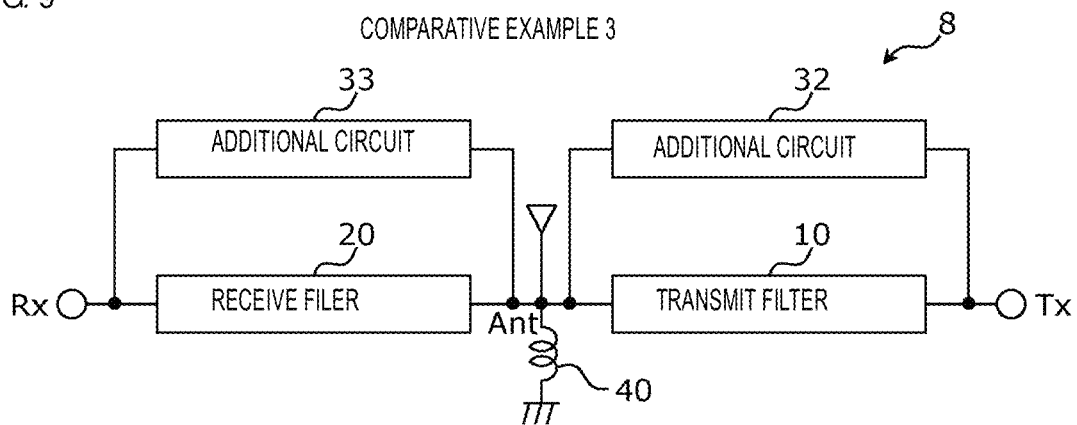
FIG. 9 is a circuit diagram illustrating an example of a configuration of a duplexer according to Comparative Example 3.

FIG. 9 is a circuit diagram illustrating an example of a configuration of a duplexer according to Comparative Example 3. A duplexer 8 illustrated in FIG. 9 differs from the duplexer 1 in FIG. 1 in that the additional circuit 31 is removed and an additional circuit 33 is added. The configuration of the duplexer 8 corresponds to the configuration disclosed in FIG. 17D in Japanese Unexamined Patent Application Publication No. 2013-118611.

The additional circuit 33 generates a third cancellation signal for a third signal component targeted for cancellation in the transmit frequency band out of signals transferred between the terminals Rx and Ant via the receive filter 20. The third cancellation signal is determined such that, when the third cancellation signal and the third signal component are added together, the amplitude of the addition result is smaller than the amplitude of the third signal component. The third cancellation signal is of an opposite phase and of an identical or substantially identical amplitude with respect to the third signal component.

One end of the additional circuit 33 is coupled to the terminal Rx while the other end of the additional circuit 33 is coupled to the terminal Ant.

Figure 10:
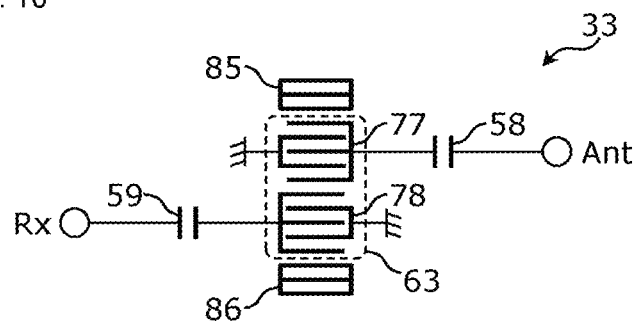
FIG. 10 is a circuit diagram illustrating an example of a configuration of a third additional circuit according to Comparative Example 3.

FIG. 10 is a circuit diagram illustrating an example of a configuration of the additional circuit 33. As illustrated in FIG. 10, the additional circuit 33 includes a resonator group 63 including IDT electrodes 77 and 78 aligned in a propagation direction of acoustic waves (an up-down direction in FIG. 10), reflectors 85 and 86, and capacitors 58 and 59.

The IDT electrodes 77 and 78 each include a pair of comb-shaped electrodes. The comb-shaped electrodes each include a plurality of electrode fingers extending in a direction (a left-right direction in FIG. 10) perpendicular or substantially perpendicular to the propagation direction of acoustic waves and a busbar electrode coupling one ends of the plurality of electrode fingers to each other. The number of electrode fingers for one IDT electrode is not limited to five as illustrated in FIG. 10 as an example but may differ between the IDT electrodes 77 and 78.

In the example in FIG. 10, the resonator group 63 defines, in combination with the reflectors 85 and 86, a longitudinally coupled resonator that transfers signals by using acoustic wave coupling, but the configuration is not limited to this example. The resonator group 63 may define a transversal filter that transfers signals by using acoustic wave propagation. In the transversal filter, a sound-absorbing member may be provided instead of the reflectors 85 and 86.

The sectional structure of the resonator group 63 is identical or substantially identical to the sectional structure of the resonator groups 61 and 62 described above, and the description thereof is thus not repeated.

Electrical characteristics of the duplexers 1, 6, 7, and 8 configured as described above were measured by simulation.

In the simulation, the IDT electrodes 71 to 74 were configured in accordance with the electrode parameters indicated in Table 1 and the IDT electrodes 75 and 76 were configured in accordance with the electrode parameters indicated in Table 2. The electrode parameters in Tables 1 and 2 indicate that, for example, the IDT electrode 71 includes five electrode fingers arranged at pitches of about 3.5207 μm and nine electrode fingers arranged at pitches of about 3.6449 μm. The same is true for the IDT electrodes 72 to 76. The average pitch of electrode fingers of the IDT electrodes 71 to 74 was about 3.7897 μm while the average pitch of electrode fingers of the IDT electrodes 75 and 76 was about 3.6238 μm.

TABLE 1

| IDT electrode | Electrode finger count (piece) | Electrode finger pitch (μm) | Average electrode finger pitch (μm) |
|---|---|---|---|
| 71 | 5 | 3.5207 | 3.7897 |
|    | 9 | 3.6449 |   |
| 72 | 5 | 3.9714 |   |
|    | 7 | 3.8430 |   |
| 73 | 7 | 3.4815 |   |
|    | 9 | 3.6340 |   |
| 74 | 7 | 4.0948 |   |
|    | 9 | 4.0997 |   |

TABLE 2

| IDT electrode | Electrode finger count (piece) | Electrode finger pitch (μm) | Average electrode finger pitch (μm) |
|---|---|---|---|
| 75 | 5  | 3.3470 | 3.6238 |
|    | 10 | 3.5558 |   |
| 76 | 16 | 3.7593 |   |
|    | 5  | 3.6031 |   |

The uplink frequency band (for example, about 880 MHz to about 915 MHz) of long term evolution (LTE) band 8 is used as the transmit frequency band and the downlink frequency band (for example, about 925 MHz to about 960 MHz) of LTE band 8 is used as the receive frequency band. In the drawings, the transmit frequency band and the receive frequency band are shortly referred to as the transmit band and the receive band.

Figure 11A:
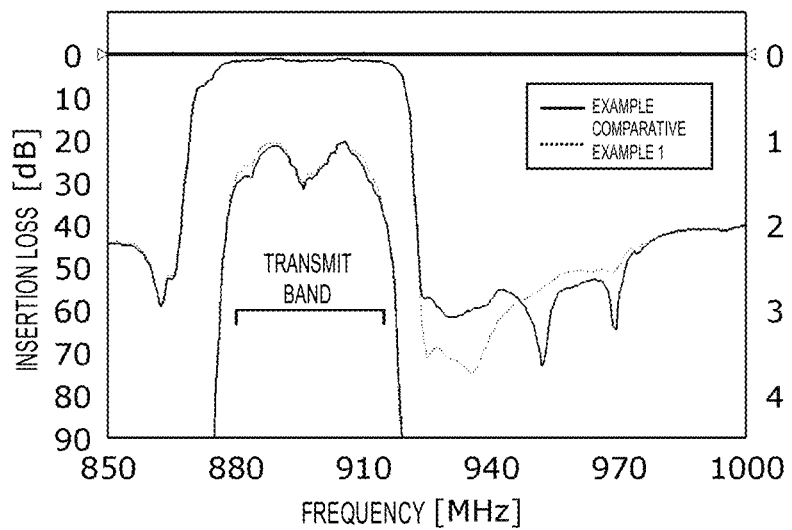
FIG. 11A is a graph illustrating an example of the transfer characteristic between a transmit terminal and an antenna terminal of a duplexer according to a preferred embodiment of the present invention in contrast with Comparative Example 1.

FIG. 11A is a graph illustrating the transfer characteristic from the terminal Tx to the terminal Ant in a manner in which Example (a solid line) and Comparative Example 1 (a dotted line) are contrasted with each other.

Figure 11B:
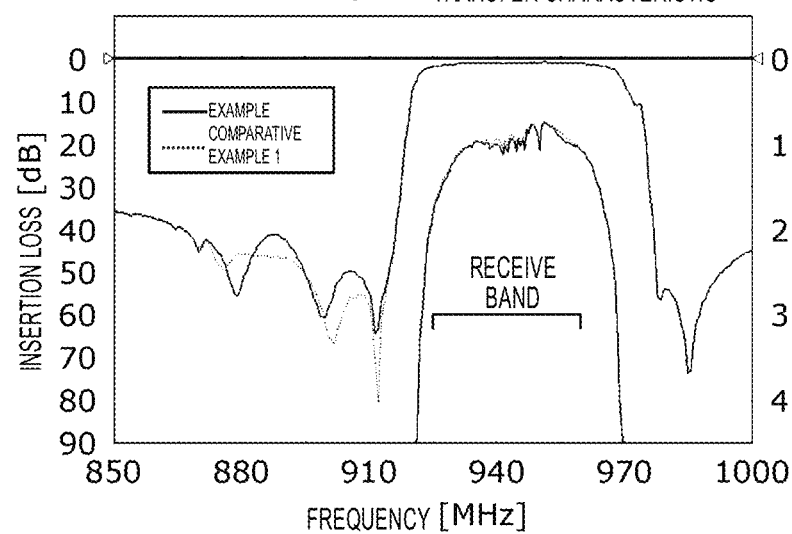
FIG. 11B is a graph illustrating an example of the transfer characteristic between the antenna terminal and a receive terminal of a duplexer according to a preferred embodiment of the present invention in contrast with Comparative Example 1.

FIG. 11B is a graph illustrating the transfer characteristic from the terminal Ant to the terminal Rx in a manner in which Example (a solid line) and Comparative Example 1 (a dotted line) are contrasted with each other.

FIG. 11C is a graph illustrating the isolation characteristic from the terminal Tx to the terminal Rx in a manner in which Example (a solid line) and Comparative Example 1 (a dotted line) are contrasted with each other.

According to FIG. 11C, the worst value of isolation in the transmit frequency band was about 45.8 dB in Comparative Example 1 and about 59.1 dB in Example. The worst value of isolation in the receive frequency band was about 52.7 dB in Comparative Example 1 and about 58.7 dB in Example. This means that, in Example, isolation is improved (strengthened) in both the transmit frequency band and the receive frequency band in comparison to Comparative Example 1.

According to FIGS. 11A and 11B, loss in the transmit frequency band and loss in the receive frequency band were hardly degraded (increased) in Example in comparison to Comparative Example 1. This means that the additional circuit 31 and the additional circuit 32 are not factors that degrade the loss.

Figure 12A:
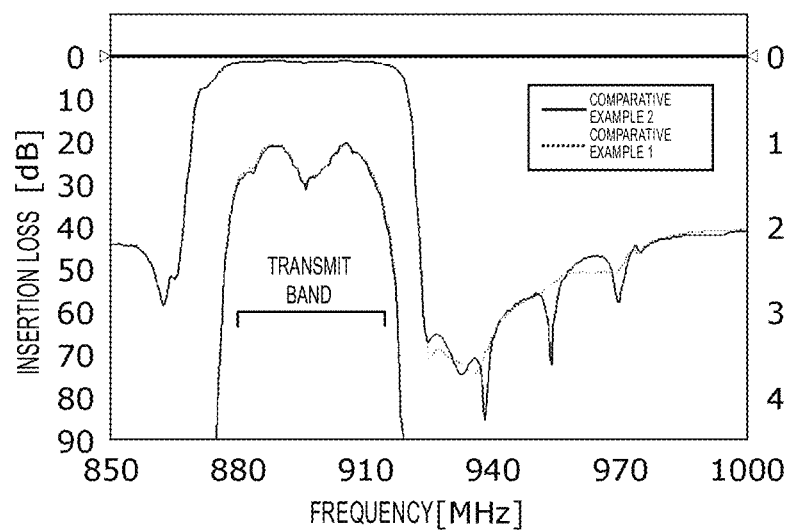
FIG. 12A is a graph illustrating an example of the transfer characteristic between a transmit terminal and an antenna terminal of the duplexer according to Comparative Example 2 in contrast with Comparative Example 1.

FIG. 12A is a graph illustrating the transfer characteristic from the terminal Tx to the terminal Ant in a manner in which Comparative Example 2 (a solid line) and Comparative Example 1 (a dotted line) are contrasted with each other.

Figure 12B:
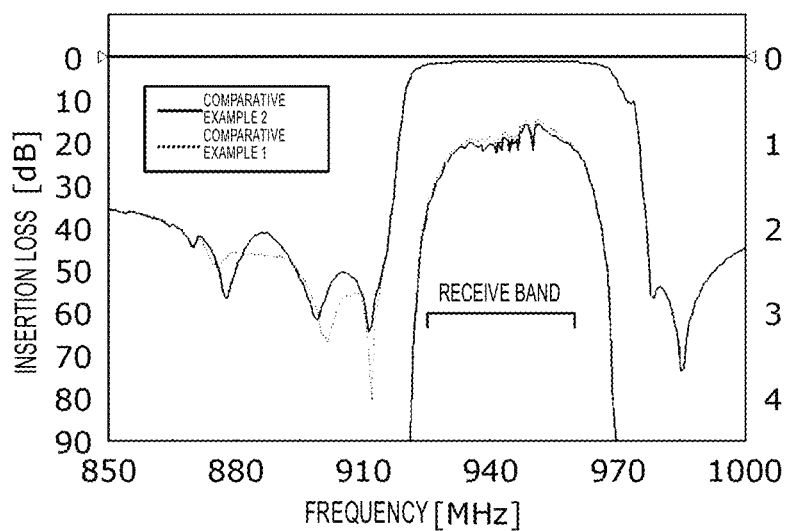
FIG. 12B is a graph illustrating an example of the transfer characteristic between the antenna terminal and a receive terminal of the duplexer according to Comparative Example 2 in contrast with Comparative Example 1.

FIG. 12B is a graph illustrating the transfer characteristic from the terminal Ant to the terminal Rx in a manner in which Comparative Example 2 (a solid line) and Comparative Example 1 (a dotted line) are contrasted with each other.

FIG. 12C is a graph illustrating the isolation characteristic from the terminal Tx to the terminal Rx in a manner in which Comparative Example 2 (a solid line) and Comparative Example 1 (a dotted line) are contrasted with each other.

According to FIG. 12C, the worst value of isolation in the transmit frequency band in Comparative Example 2 was about 55.2 dB and the worst value of isolation in the receive frequency band in Comparative Example 2 was about 49.8 dB. In comparison to Comparative Example 1, in Comparative Example 2, isolation in the transmit frequency band is improved (strengthened), whereas isolation at a portion (a circled portion) in the receive frequency band is degraded (weakened).

This is considered to result from the following reason.

In the duplexer 7 (refer to FIG. 8) of Comparative Example 2, the additional circuit 31 is coupled between the terminals Tx and Rx but no configuration corresponds to the additional circuit 32 in the duplexer 1. As a result, in the duplexer 7, it is necessary to generate a cancellation signal covering a wide frequency band including both the transmit frequency band and the receive frequency band by using only the additional circuit 31.

However, due to the insufficient electromechanical coupling coefficient, the actual additional circuit 31 is not necessarily able to generate a cancellation signal in antiphase with respect to signals targeted for cancellation over a wide frequency band. This is because the electromechanical coupling coefficient regarding the additional circuit 31 cannot be increased without limitation because the electromechanical coupling coefficient is determined in accordance with the electrical characteristic required for the transmit filter 10 and the electrical characteristic required for the receive filter 20.

It is assumed that, in the example in FIG. 12C, the cancellation signal generated by the additional circuit 31 was not in antiphase with respect to signals targeted for cancellation in the receive frequency band due to the cause described above, and as a result, isolation was degraded (weakened) in the receive frequency band.

Figure 13A:
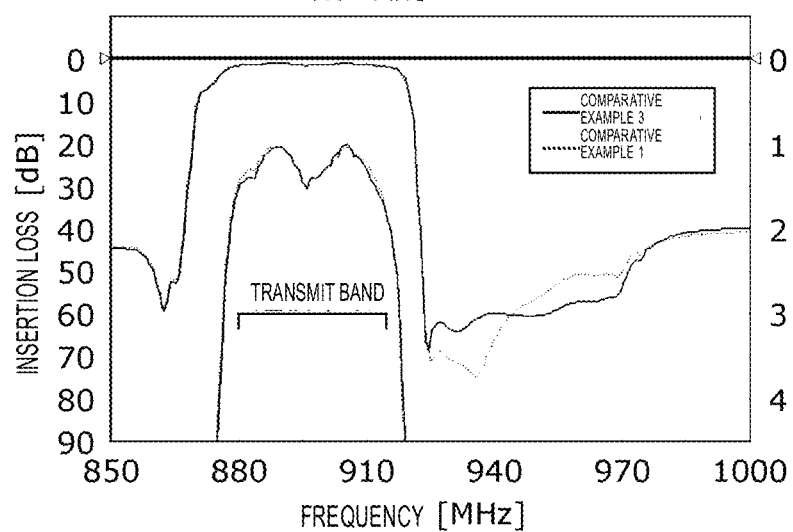
FIG. 13A is a graph illustrating an example of the transfer characteristic between a transmit terminal and an antenna terminal of the duplexer according to Comparative Example 3 in contrast with Comparative Example 1.

FIG. 13A is a graph illustrating the transfer characteristic from the terminal Tx to the terminal Ant in a manner in which Comparative Example 3 (a solid line) and Comparative Example 1 (a dotted line) are contrasted with each other.

Figure 13B:
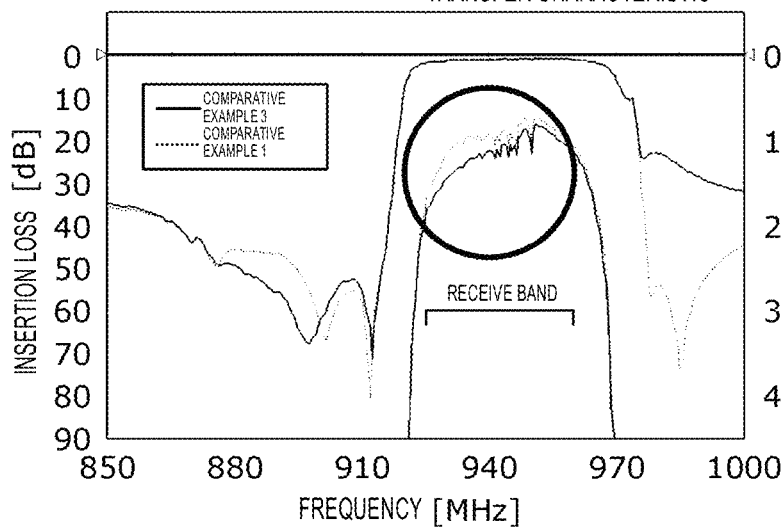
FIG. 13B is a graph illustrating an example of the transfer characteristic between the antenna terminal and a receive terminal of the duplexer according to Comparative Example 3 in contrast with Comparative Example 1.

FIG. 13B is a graph illustrating the transfer characteristic from the terminal Ant to the terminal Rx in a manner in which Comparative Example 3 (a solid line) and Comparative Example 1 (a dotted line) are contrasted with each other.

Figure 13C:
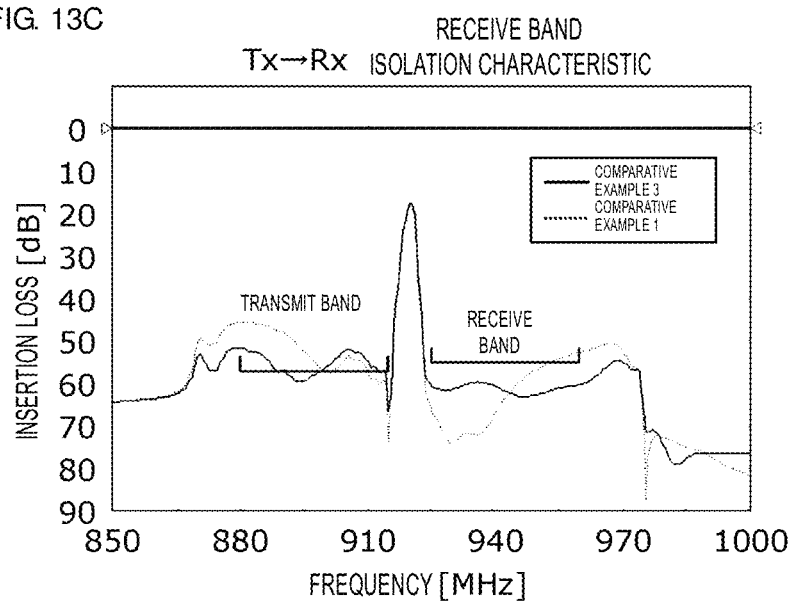
FIG. 13C is a graph illustrating an example of the transfer characteristic between the transmit terminal and the receive terminal of the duplexer according to Comparative Example 3 in contrast with Comparative Example 1.

FIG. 13C is a graph illustrating the isolation characteristic from the terminal Tx to the terminal Rx in a manner in which Comparative Example 3 (a solid line) and Comparative Example 1 (a dotted line) are contrasted with each other.

According to FIG. 13C, the worst value of isolation in the transmit frequency band in Comparative Example 3 was about 51.7 dB and the worst value of isolation in the receive frequency band in Comparative Example 3 was about 59.6 dB. In Comparative Example 3, isolation is improved (increased) in both the transmit frequency band and the receive frequency band in comparison to Comparative Example 1.

According to FIG. 13A, loss in the transmit frequency band in Comparative Example 3 is hardly degraded (increased) in comparison to Comparative Example 1.

According to FIG. 13B, the worst value of loss in the receive frequency band was about 1.76 dB in Comparative Example 1 and about 1.89 dB in Comparative Example 3. In other words, in Comparative Example 3, loss was degraded (increased) at the entire range (a circled portion) of the receive frequency band in comparison to Comparative Example 1.

This is considered to result from the following reason.

In the duplexer 8 (refer to FIG. 9) of Comparative Example 3, the additional circuit 32 is coupled between the terminals Tx and Ant and the additional circuit 33 is coupled between the terminals Ant and Rx, but no configuration corresponds to the additional circuit 31 in the duplexer 1. As a result, in the duplexer 8, the additional circuit 32 generates a cancellation signal in antiphase with respect to signals targeted for cancellation in the receive frequency band and the additional circuit 33 generates a cancellation signal in antiphase with respect to signals targeted for cancellation in the transmit frequency band.

However, since in the duplexer 8 the additional circuit 33 generates a cancellation signal targeting the transmit frequency band, loss due to bulk radiation caused by the additional circuit 33 occurs in a frequency band higher than the transmit frequency band.

It is assumed that, in the example in FIG. 13B, loss due to bulk radiation caused by the additional circuit 33 as described above occurred in the receive frequency band, and as a result, loss between the terminals Ant and Rx was degraded (increased) in the receive frequency band.

Furthermore, in the duplexer 8, the signal path targeted for cancellation by the additional circuit 32 and the additional circuit 33 is shorter than the signal path targeted for cancellation by the additional circuit 31, and as a result, there is a concern that the effect of improving isolation is weakened.

As described above, in comparison to the duplexer 6 of Comparative Example 1, in the duplexer 1 according to Example, isolation is improved in both the transmit frequency band and the receive frequency band while loss is hardly degraded. The duplexer 1 causes neither degradation of isolation in the receive frequency band, which is observed in the duplexer 7 of Comparative Example 2, nor degradation of loss in the receive frequency band, which is observed in the duplexer 8 of Comparative Example 3.

As such, the duplexer 1 achieves comprehensively favorable filter characteristics.

Next, the reason why the duplexer 1 achieves the comprehensively favorable filter characteristics is explained.

Figure 14A:
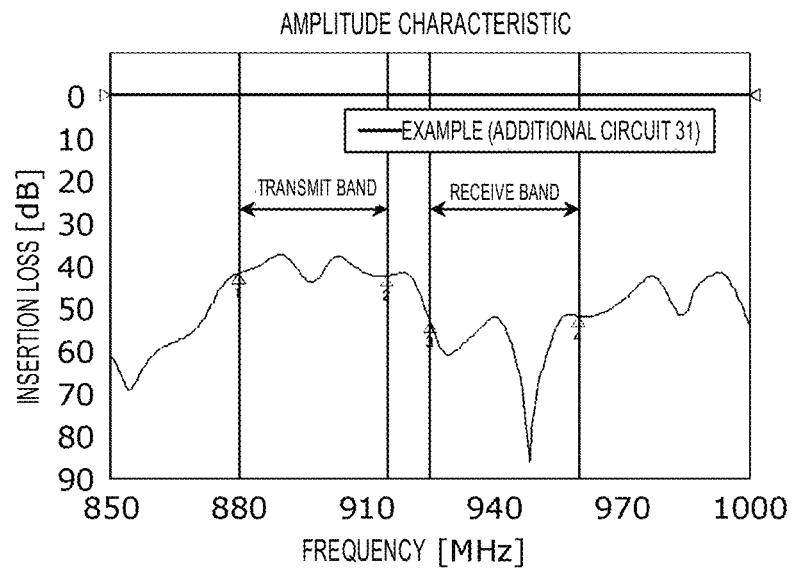
FIG. 14A is a graph illustrating an example of the amplitude characteristic of a first additional circuit according to a preferred embodiment of the present invention.
Figure 14B:
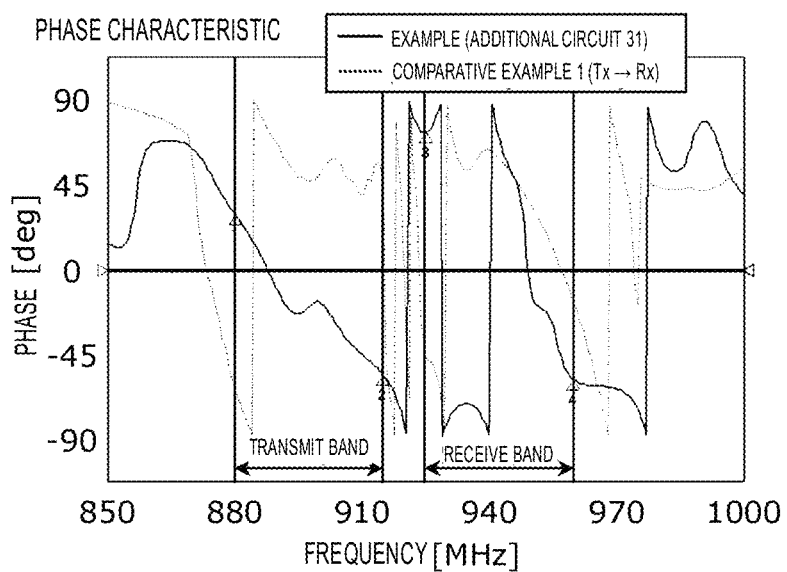
FIG. 14B is a graph illustrating an example of the phase characteristic of a first additional circuit according to a preferred embodiment of the present invention in contrast with Comparative Example 1.

FIGS. 14A and 14B are graphs illustrating an example of the amplitude characteristic and the phase characteristic of the additional circuit 31. For the purpose of comparison, FIG. 14B also illustrates the phase characteristic between the terminals Tx and Rx in the duplexer 6 according to Comparative Example 1.

In a frequency region in which the absolute value of difference between the phase characteristic of the additional circuit 31 and the phase characteristic between the terminals Tx and Rx in the duplexer 6 is greater than 90° and equal to or less than 180°, the additional circuit 31 exerts the cancellation effect, that is, the isolation improvement effect.

In FIG. 14B, concerning the transmit frequency band, the absolute value of phase difference is greater than 90° and equal to or less than 180° across the entire or almost the entire region, and as a result, the cancellation effect is provided. By contrast, concerning the receive frequency band, the phase difference is equal to or less than 90° in many regions, and as a result, the cancellation effect is not sufficiently exerted. This is because the electromechanical coupling coefficient of the additional circuit 31 is inadequate.

In the frequency region in which the phase difference is equal to or less than 90°, the additional circuit 31 simply defines and functions as parasitic capacitance, and thus, signals leak between the terminals Tx and Rx through the additional circuit 31 and isolation is degraded due to the leaking signals.

In consideration of this circumstance, as illustrated in FIG. 14A, a frequency (hereinafter referred to as a peak frequency) at which the peak of the amplitude characteristic of the additional circuit 31 appears is set within the transmit frequency band, so that attenuation is increased in the receive frequency band in comparison to the transmit frequency band. This configuration reduces or prevents signals leaking through the additional circuit 31 in the receive frequency band, and consequently, it is possible to reduce or minimize degradation of isolation in the receive frequency band.

Figure 15A:
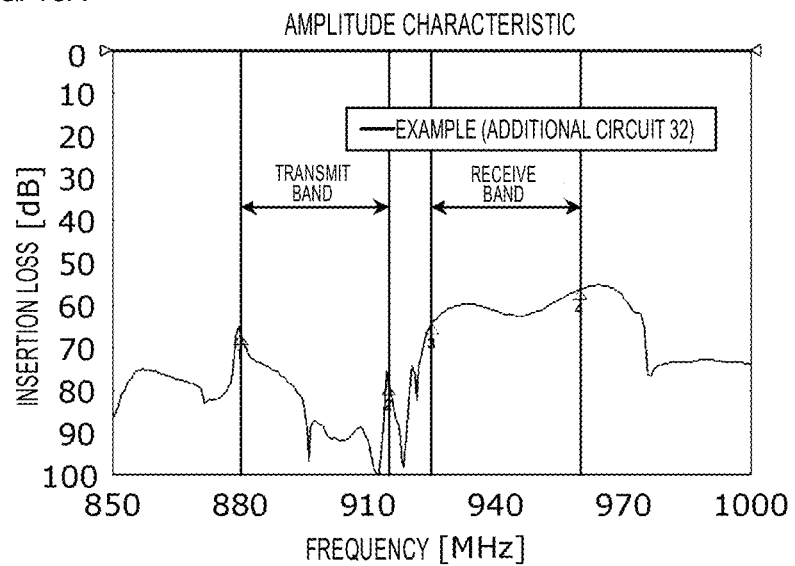
FIG. 15A is a graph illustrating an example of the amplitude characteristic of a second additional circuit according to a preferred embodiment of the present invention.
Figure 15B:
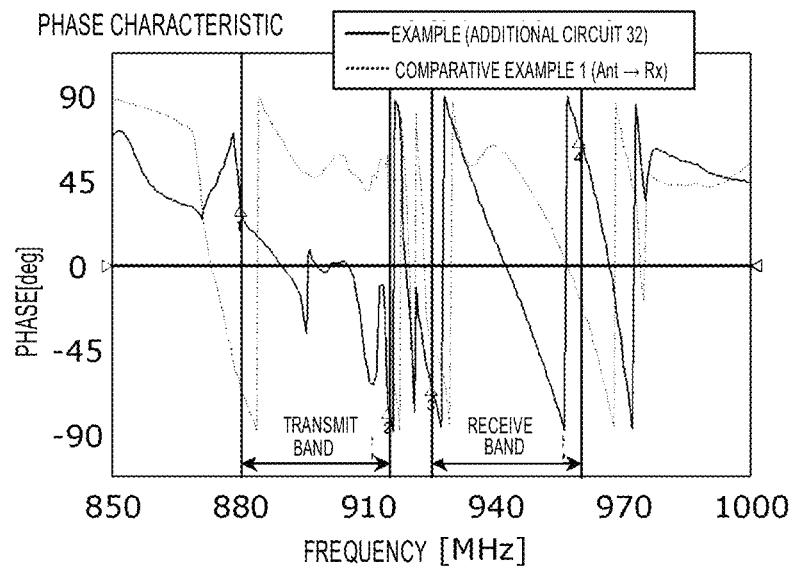
FIG. 15B is a graph illustrating an example of the phase characteristic of a second additional circuit according to a preferred embodiment of the present invention in contrast with Comparative Example 1.

FIGS. 15A and 15B are graphs illustrating an example of the amplitude characteristic and the phase characteristic of the additional circuit 32. For the purpose of comparison, FIG. 15B also illustrates the phase characteristic between the terminals Ant and Rx in the duplexer 6 according to Comparative Example 1.

In a frequency region in which the absolute value of difference between the phase characteristic of the additional circuit 32 and the phase characteristic between the terminals Ant and Rx in the duplexer 6 is greater than 90° and equal to or less than 180°, the additional circuit 32 exerts the cancellation effect.

At this time, loss due to bulk radiation caused by the additional circuit 32 occurs in a frequency band higher than the receive frequency band. However, since the average pitch of electrode fingers of the IDT electrodes 71 to 74 in the additional circuit 31 is greater than the average pitch of electrode fingers of the IDT electrodes 75 and 76 in the additional circuit 32, the peak frequency regarding the amplitude characteristic of the additional circuit 32 is present in a region higher than the transmit frequency band including the peak frequency regarding the amplitude characteristic of the additional circuit 31 and frequencies at which bulk radiation occurs are present outside the receive frequency band; and consequently, degradation of loss in the receive frequency band does not easily occur.

In the case in which, oppositely to the configuration in the duplexer 1, the average pitch of electrode fingers of the IDT electrodes 71 to 74 in the additional circuit 31 is smaller than the average pitch of electrode fingers of the IDT electrodes 75 and 76 in the additional circuit 32, loss due to bulk radiation caused by the additional circuit 32 occurs in the receive frequency band. As such, deterioration of loss in the receive frequency band occurs on the same principle as that of Comparative Example 3.

As described above, the duplexer 1 achieves the comprehensively favorable filter characteristics.

Hereinafter, other advantageous effects of the duplexer 1 will be described.

Concerning the additional circuit 31, the capacitors 53 and 54 are coupled between the resonator group 61 and the terminal Tx and the capacitors 55 and 56 are coupled between the resonator group 61 and the terminal Rx. Since the capacitors 53 to 56 are coupled on both sides of the resonator group 61, when the resonator group 61 defines and functions as parasitic capacitance, the parasitic component can be relatively small due to the capacitors 53 to 56, and as a result, it is possible to reduce or prevent degradation of isolation due to parasitic capacitance in the additional circuit 31.

Concerning the additional circuit 32, it is unnecessary to generate a cancellation signal covering a wide frequency band including both the transmit frequency band and the receive frequency band, and thus, only the capacitor 57 has to be coupled between the resonator group 62 and the terminal Rx as illustrated in FIG. 5, which enables a reduction of the chip size.

The number of IDT electrodes defining the resonator group 61 in the additional circuit 31 is greater than the number of IDT electrodes defining the resonator group 62 in the additional circuit 32. Specifically, the number of IDT electrodes defining the resonator group 61 in the additional circuit 31 may be four or more and the number of IDT electrodes defining the resonator group 62 in the additional circuit 32 may be two, for example.

Since the resonator group 61 includes many IDT electrodes, the pass band width of the resonator group 61 is widened. This compensates for the inadequacy of the electromechanical coupling coefficient to some extent. As such, the cancellation effect is provided in a wider frequency range, and as a result, it is possible to reduce or prevent degradation of isolation in the receive frequency band due to the additional circuit 31. Here, because the pitch of electrode fingers differs among all the IDT electrodes, the pass band width of the resonator group 61 can be effectively widened.

In contrast, since the additional circuit 32 generates a cancellation signal targeting only the receive frequency band, although the pass band width of the resonator group 62 is relatively narrow, the additional circuit 32 can provide the cancellation effect. The minimum configuration including two IDT electrodes can enable a reduction in the chip size.

The transmit filter 10 and the receive filter 20 are preferably both ladder filters, for example. For example, when the receive filter 20 is configured as a ladder filter, changes in the phase characteristic in the transmit frequency band are relatively small. This configuration facilitates generation of a cancellation signal targeting the transmit frequency band with the powerful cancellation effect in the additional circuit 31, and as a result, it is possible to more reliably improve isolation in the transmit frequency band.

For the purpose of lessening changes in the phase characteristic of the receive filter 20 in the transmit frequency band, parallel arms of different resonant frequencies may be provided. A parallel arm is a circuit that includes a corresponding one of the parallel resonators 25 to 27 and that is coupled between ground and a corresponding node on the signal path connecting the terminals Ant and Rx. Providing the parallel arms of different resonant frequencies facilitates instantaneous changes in the phase characteristic that occur when the resonant frequencies are identical or substantially identical among a plurality of parallel arms.

In the example in FIG. 3, the inductor 41 is coupled in series with the parallel resonator 25, whereas no inductor is coupled to the parallel resonator 26. As such, it is possible to configure the resonant frequency to differ between the parallel arm including the parallel resonator 25 and the parallel arm including the parallel resonator 26 in accordance with whether an inductor is included.

The multiplexers according to preferred embodiments of the present invention have been described above using the example of duplexer, but the present invention is not limited to the individual preferred embodiments described above. Without departing from the scope of the present invention, preferred embodiments obtained by making various modifications, which occur to those skilled in the art, on the present preferred embodiment and preferred embodiments provided by combining the elements in different preferred embodiments with each other may be also embraced in the range of one or more aspects of the present invention.

For example, the configuration of the duplexer described above may be applied to a diplexer in which two kinds of signals in different frequency bands are separated and combined by using two filters of different pass bands. Furthermore, the configuration of the duplexer may be applied to a multiplexer in which three or more kinds of signals in different frequency bands are separated and combined by using three or more filters of different pass bands.

Preferred embodiments of the present invention can be used as a multiplexer including additional circuits widely for communication devices, such as a mobile phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal, a first terminal, and a second terminal;
   a first filter including one end coupled to the first terminal and another end coupled to the common terminal, a pass band of the first filter being a first frequency band;
   a second filter including one end coupled to the second terminal and another end coupled to the common terminal, a pass band of the second filter being a second frequency band including a center frequency higher than a center frequency of the first frequency band;
   a first additional circuit including one end coupled to the first terminal and another end coupled to the second terminal; and
   a second additional circuit including one end coupled to the first terminal and another end coupled to the common terminal; wherein
   the first additional circuit includes a first resonator group including a plurality of first interdigital transducer electrodes aligned in a propagation direction of an acoustic wave;

the second additional circuit includes a second resonator group including a plurality of second interdigital transducer electrodes aligned in a propagation direction of an acoustic wave; and an average pitch of electrode fingers of the plurality of first interdigital transducer electrodes is greater than an average pitch of electrode fingers of the plurality of second interdigital transducer electrodes.

2. The multiplexer according to claim 1, wherein a peak frequency of an amplitude characteristic of the first additional circuit is included in the first frequency band and a peak frequency of an amplitude characteristic of the second additional circuit is included in the second frequency band.

3. The multiplexer according to claim 1, wherein
a first capacitive element is coupled between the first resonator group and the first terminal; and
a second capacitive element is coupled between the first resonator group and the second terminal.

4. The multiplexer according to claim 1, wherein a number of the plurality of first interdigital transducer electrodes is greater than a number of the plurality of second interdigital transducer electrodes.

5. The multiplexer according to claim 1, wherein the second filter includes a series circuit in which a resonator and an inductor are coupled in series between ground and a node on a signal path connecting the second terminal and the common terminal.

6. The multiplexer according to claim 1, wherein the first filter and the second filter are both ladder filters.

7. The multiplexer according to claim 1, wherein the first filter is a transmit filter and the second filter is a receive filter.

8. The multiplexer according to claim 1, wherein
the first filter includes series arm resonators and parallel arm resonators;
the series arm resonators are coupled in series between the first terminal and the common terminal; and
a capacitor is coupled to the series arm resonators in a bridge configuration.

9. The multiplexer according to claim 8, wherein each of the series arm resonators and the parallel arm resonators is a surface acoustic wave resonator.

10. The multiplexer according to claim 1, wherein
the second filter includes series arm resonators and parallel arm resonators;
the series arm resonators are coupled in series between the second terminal and the common terminal; and
an inductor is coupled between one of the parallel arm resonators and ground.

11. The multiplexer according to claim 10, wherein the second filter further includes a capacitor coupled to another one of the parallel arm resonators in a bridge configuration.

12. The multiplexer according to claim 1, wherein the first resonator group includes a substrate, the plurality of first interdigital transducer electrodes provided on a major surface of the substrate, and a protective layer covering the plurality of first interdigital transducer electrodes.

13. The multiplexer according to claim 12, wherein the substrate is made of a piezoelectric material of Y-cut lithium niobate single crystal.

14. The multiplexer according to claim 12, wherein the plurality of first interdigital transducer electrodes are made of an alloy mainly including aluminum.

15. The multiplexer according to claim 12, wherein the protective layer is made of a film mainly including silicon dioxide.

16. The multiplexer according to claim 1, wherein the second resonator group includes a substrate, the plurality of second interdigital transducer electrodes provided on a major surface of the substrate, and a protective layer covering the plurality of first interdigital transducer electrodes.

17. The multiplexer according to claim 16, wherein the substrate is made of a piezoelectric material of Y-cut lithium niobate single crystal.

18. The multiplexer according to claim 16, wherein the plurality of second interdigital transducer electrodes are made of an alloy mainly including aluminum.

19. The multiplexer according to claim 16, wherein the protective layer is made of a film mainly including silicon dioxide.

* * * * *